United States Patent
Lu

(10) Patent No.: US 9,202,991 B2
(45) Date of Patent: Dec. 1, 2015

(54) FLUORESCENT MATERIAL OF LIGHT-EMITTING DIODE AND METHOD FOR PREPARING THE SAME

(71) Applicant: NATIONAL TAIWAN UNIVERSITY, Taipei (TW)

(72) Inventor: Chung-Hsin Lu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 176 days.

(21) Appl. No.: 13/929,819

(22) Filed: Jun. 28, 2013

(65) Prior Publication Data

US 2014/0001404 A1 Jan. 2, 2014

(30) Foreign Application Priority Data

Jun. 29, 2012 (TW) ............................. 101123446 A

(51) Int. Cl.
| | |
|---|---|
| *H01L 33/50* | (2010.01) |
| *C09K 11/02* | (2006.01) |
| *C09K 11/08* | (2006.01) |
| *C09K 11/58* | (2006.01) |
| *C09K 11/62* | (2006.01) |
| *C09K 11/74* | (2006.01) |
| *C09K 11/75* | (2006.01) |
| *C09K 11/77* | (2006.01) |

(52) U.S. Cl.
CPC ............. *H01L 33/502* (2013.01); *C09K 11/02* (2013.01); *C09K 11/0883* (2013.01); *C09K 11/58* (2013.01); *C09K 11/62* (2013.01); *C09K 11/7442* (2013.01); *C09K 11/757* (2013.01); *C09K 11/7706* (2013.01)

(58) Field of Classification Search
CPC ............... C09K 11/0883; C09K 11/02; C09K 11/7706; H01L 33/502
USPC ....... 252/301.4 F; 428/404; 427/215; 257/98; 313/503
See application file for complete search history.

(56) References Cited

U.S. PATENT DOCUMENTS

2010/0264809 A1* 10/2010 Winkler et al. ............... 313/483
2010/0283076 A1* 11/2010 Winkler et al. ................. 257/98

* cited by examiner

*Primary Examiner* — Carol M Koslow
(74) *Attorney, Agent, or Firm* — CKC & Partners Co., Ltd.

(57) ABSTRACT

The present invention relates to an inorganic nitride-based fluorescent material, comprising an inorganic fluorescent host material represented by the following formula (I):

$$(M)_x Si_y N_z : At \tag{I}$$

wherein, M is at least one metal selected from the group consisting of metals of IIA and IIIA, and x is from 1.0 to 3.0, and y is from 0.7 to 6.0, and z is from 1.0 to 9.0 and At is an activator; and a surface coating material is at least one metal oxide, metal hydroxide or metal carbonate, and the metal of the metal oxide, the metal hydroxide or the metal carbonate is selected from the group consisting of Mg, Ca, Sr, Ba, V, Cr, Mn, Fe, Co, Ni, Cu, La, Ga, In, Sn, Sb and Bi.

9 Claims, 3 Drawing Sheets

FLUORESCENT MATERIAL OF LIGHT-EMITTING DIODE AND METHOD FOR PREPARING THE SAME

RELATED APPLICATIONS

This application claims priority to Taiwanese Application Serial Number 101123446, filed Jun. 29, 2012, which is herein incorporated by reference.

BACKGROUND

1. Field of Invention

The invention relates to an inorganic fluorescent material and a method for preparing the same, and more particularly relates to an inorganic nitride-based fluorescent material in which a metal oxide, a metal hydroxide, or a metal carbonate is coated on a surface of a nitride-based fluorescent host material.

2. Description of Related Art

A light-emitting diode (LED) features compact volume, rapid response speed, low power consumption, long lifetime, and high reliability. The LED has been used as an indicator lamp and applied in a display panel from the beginning. With development of white LED, the LED now has been widely applied for illumination.

Currently, the white LED utilizes a blue LED chip emitting a blue light to excite electrons in a yellow phosphor (e.g., YAG: $Ce^{3+}$), such that part of the blue light emitted by the blue LED chip is converted into a broad band consisting mainly of yellow light. By mixing the unconverted blue light and the yellow light, which can stimulate the red-light receptor and the green-light receptor in human eyes, a white light is presented in the eyes. However, the application of the yellow phosphor is limited by a high correlated color temperature (about 4,500 to 11,000 K) and low color-rendering index (CRI) thereof.

Accordingly, to obtain a warm white light of high quality, a nitride material that can produce red light can be applied as a phosphor. Since the nitride-based fluorescent material is capable of emitting a red-light broad band, the CRI of the white LED can be improved. Further, the nitride-based fluorescent material has excellent environmental stability, non-toxicity and high light emitting efficiency, and is applicable to the white LED device.

Nonetheless, in operation of the LED device, a LED chip generates heat causing a temperature rise through the entire LED device. The elevated temperature reduces the light-emitting efficiency of the fluorescent material referred to as "thermal quenching". As such, the thermal stability of the fluorescent material becomes poor and influences the light-emitting efficiency of the LED device, and even reduces the service life of the LED device.

Therefore, to address the aforesaid problems, it is desired to develop an inorganic nitride-based fluorescent material, which is applicable to a white LED device, which can not only provide a great luminance but also has excellent thermal stability, so as to prolong the service life of the LED device.

SUMMARY

The invention is mainly directed to provide an inorganic nitride-based fluorescent material, wherein the fluorescent material applied to the LED is enabled to have a high luminance and high thermal stability by coating a metal oxide, metal hydroxide, or metal carbonate on a surface of a fluorescent host material.

The invention is also directed to provide a method for preparing an inorganic fluorescent material, which can prepare an inorganic fluorescent material with a high luminance and high thermal stability through a simple process, so as to reduce the cost for preparing the LED.

In order to achieve the aforesaid purposes, the invention provides an inorganic nitride-based fluorescent material including: an inorganic fluorescent host material represented by the following formula (I):

$(M)_xSi_yN_z:At$          formula (I)

wherein M is at least one metal selected from the group consisting of metals of IIA and IIIA, and x is from 1.0 to 3.0, and y is from 0.7 to 6.0, and z is from 1.0 to 9.0 and At is an activator; and a surface coating material is at least one metal oxide metal hydroxide or metal carbonate, and the metal of the metal oxide, the metal hydroxide, or the metal carbonate is selected from the group consisting of metals of Mg, Ca, Sr, Ba, V, Cr, Mn, Fe, Co, Ni, Cu, La, Ga, In, Sn, Sb and Bi.

Furthermore, the invention additionally provides a method for preparing an inorganic fluorescent material, which includes the following steps: (A) preparing an inorganic host fluorescent material, wherein the inorganic fluorescent material has a composition represented by the following formula (I):

$(M)_xSi_yN_z:At$          formula (I)

wherein M is at least one metal selected from the group consisting of metals of IIA and IIIA, and x is from 1.0 to 3.0, and y is from 0.7 to 6.0, and z is from 1.0 to 9.0, and At is an activator; (B) adding the inorganic fluorescent host material into an inorganic metal salt solution to form a mixed solution under uniformly stirring, wherein the metal of the inorganic metal salt is selected from the group consisting of Mg, Ca, Sr, Ba, V, Cr, Mn, Fe, Co, Ni, Cu, La, Ga, In, Sn, Sb and Bi; (C) adjusting the pH value of the mixed solution prepared from step (B) via a pH adjusting agent, such that metal ions are deposited on the surface of the inorganic fluorescent host; and (D) filtering the mixed solution prepared from step (C) to obtain a powder, and then drying the powder under heat to form the inorganic fluorescent material of which the surface is coated with a metal oxide, metal hydroxide, or metal carbonate.

Furthermore, the invention also provides one kind of LED devices, which is characterized in that the LED device uses the above-mentioned inorganic nitride-based fluorescent materials as a light-emitting material.

DETAILED DESCRIPTION

Figure 1:
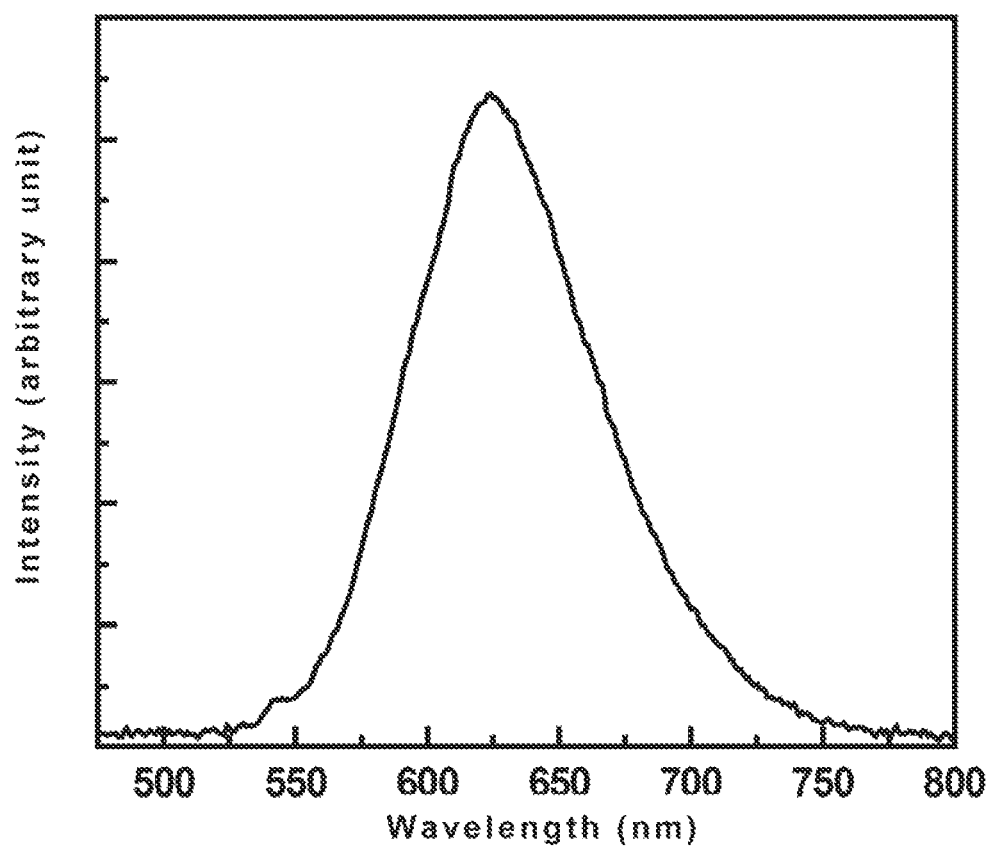
FIG. 1 is a luminescence spectrogram of a fluorescent powder prepared according to the first embodiment of the invention.

Implementation of the invention is illustrated through the following specific embodiments, and those skilled in the art can easily understand other advantages and functions of the present invention from the disclosed content of the invention. The invention also can be implemented or applied through other different specific embodiments, and various modifications and changes can be made to various details of the specification with respect to different viewpoints and applications, without departing from the spirit of the invention.

The inorganic nitride-based fluorescent material of the invention can have an improved luminance and thermal stability as the surface thereof is coated by a metal oxide, metal hydroxide, or metal carbonate. Furthermore, during the process of the method for preparing the inorganic fluorescent material of the invention, by a solution chemical method, the metal oxide, metal hydroxide, or metal carbonate is coated on the surface of the fluorescent host material to form a protective thin film, which improves heat and moisture resistance of the fluorescent material. Therefore, the LED device prepared by the preparing method disclosed in the invention can have a high luminance and high stability, which increases the service life and performance of the light-emitting diode.

For the inorganic fluorescent material and the method for preparing the same of the invention, in formula (I), M is preferably at least one metal selected from the group of calcium, strontium, barium or aluminum.

For the inorganic fluorescent material and the method for preparing the me of the invention, in formula (I), M is preferably composed of two kinds of metals with equal atomic ratio. The two kinds of metals are preferably calcium and aluminum.

For the inorganic fluorescent material and the method for preparing the same of the invention, in formula (I), and preferably x is from 1.5 to 2.5, y is from 0.8 to 5.5, and z is from 2 to 8.5.

Furthermore, the activator At is preferably selected from the group consisting of Ce, Pr, Nd, Pm, Sm, Eu, Gd, Dy, Ho, Er, Tm, Tb, Yb and Mn. In the inorganic fluorescent material and the method for preparing the same of the invention, a specific example of the inorganic fluorescent host material represented by the formula (I) is preferably $Sr_2Si_5N_8:Eu^{2+}$ or $CaAlSiN_3:Eu^{2+}$. When the fluorescent host material is $Sr_2Si_5N_8:Eu^{2+}$ or $CaAlSiN_3:Eu^{2+}$, a red-light fluorescence can be obtained. Since $Sr_2Si_5N_8:Eu^{2+}$ or $CaAlSiN_3:Eu^{2+}$ can generate a broad band of orange-red light under the excitation of blue light, the inorganic fluorescent material can be applied to the white LED.

In the inorganic fluorescent material of the invention, the surface coating material is selected from the group consisting of $MgO$, $Mg(OH)_2$, $MgCO_3$, $CaO$, $Ca(OH)_2$, $CaCO_3$, $SrCO_3$, $BaCO_3$, $V_2O_5$, $Cr_2O_3$, $Cr(OH)_3$, $Cr_2(CO_3)_3$, $Mn(OH)_2$, $MnO$, $MnCO_3$, $Fe_2O_3$, $Fe(OH)_3$, $CoO$, $Co(OH)_2$, $NiO$, $Ni(OH)_2$, $CuO$, $Cu(OH)_2$, $La_2O_3$, $La(OH)_3$, $Ga_2O_3$, $Ga(OH)_3$, $In(OH)_3$, $In_2O_3$, $SnO$, $SnO_2$, $Sn(OH)_2$, $Sn(OH)_4$, $Sb_3O_2$, $Sb(OH)_3$, $Bi_2O_3$ and $Bi(OH)_3$.

In the inorganic fluorescent material of the invention, the surface coating material thereof has 0.01 to 10 percentages by weight of the total weight of the inorganic fluorescent material. Preferably, the surface coating material has 0.1 to 5 percentages by weight of the total weight of the inorganic fluorescent material. In the inorganic fluorescent material of the invention, the thickness of the surface coating material coated on the inorganic fluorescent host material may be from 5 to 200 nm, preferably from 10 to 100 nm. When the thickness of the surface coating material coated on the inorganic fluorescent host material is too thick, the light-emitting luminance is reduced, whereas when the thickness of the surface coating material coated on the inorganic fluorescent host material is not enough, no influence can be caused.

In step (A) of the method for preparing the inorganic fluorescent material of the invention, the inorganic fluorescent host material has the composition represented by the following formula (I):

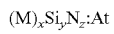    formula (I)

wherein, M, x, y, z and At are defined as above.

In step (B) of the method for preparing the inorganic fluorescent material of the invention, the inorganic fluorescent host material is added into the inorganic metal salt solution to form a mixed solution via uniformly stirring, wherein the inorganic metal salt is used as a coating material, and the metal of the inorganic metal salt is selected from the group consisting of Mg, Ca, Sr, Ba, V, Cr, Mn, Fe, Co, Ni, Cu, La, Ga, In, Sn, Sb and Bi. In particular, the metal of the inorganic metal salt is preferably Mg, Ca, Sr, Ba, La, Ga, In, Sn, Sb or Bi.

Furthermore, in step (C) of the method for preparing the inorganic fluorescent material of the invention, the pH adjusting agent may be an organic base or an inorganic base, such as urea, ammonia or sodium hydroxide, preferably urea. When urea is used to adjust the pH value, the metal salt is not easy to be deposited and is uniformly distributed in the mixed solution due to existence of urea. A precipitate is formed from the metal salt by controlling the pH value and in a form of thin film covering the surface of the inorganic fluorescent host material.

Additionally, in step (D) of the method for preparing the inorganic fluorescent material of the invention, the mixed solution prepared from step (C) is filtered and then dried at a temperature from 30° C. to 200° C. for 0.1 to 10 hours, so as to form an inorganic fluorescent material of which the surface is coated with the inorganic metal salt.

The method for preparing the inorganic fluorescent material of the invention further includes a step (E) after step (D): putting the inorganic fluorescent material of which the surface is coated with the inorganic metal salt into a high-temperature furnace to heat the inorganic fluorescent material in a vacuum atmosphere, an oxygen-containing atmosphere, a reducing atmosphere, argon or nitrogen at a temperature from 100° C. to 600° C. for 0.1 to 10 hours, so as to obtain an inorganic fluorescent powder which can be further applied to preparation of LED. The heat treatment time is preferably 1 to 4 hours.

In the LED device of the invention, the LED chip may be a blue LED chip or an ultraviolet LED chip, and preferably the LED chip is a blue LED chip.

The First Embodiment $Sr_2Si_5N_8$ fluorescent powder was added into deionized water with continuous stirring, such that the powder was uniformly distributed in the solvent. Next, an appropriate amount of $Sn(NO_3)_2$ was added and dissolved in the solution with continuous stirring. During stirring, the pH value of the solution was adjusted to 8 by ammonia solution to generate a tin-ion-containing precipitate on the fluorescent powder. The solution was stirred continuously for 1 hour and then filtered to obtain a powder. The obtained powder was placed into a reducing furnace to heat in a nitrogen atmosphere at a temperature of 250° C. for 2 hours to prepare a fluorescent powder having a surface coating metallic compound. An emission spectral analysis of the fluorescent powder was performed at room temperature via an exciting light with the wavelength of 420 nm to determine generation of a red-light emission peak with the peak value of 620 nm, wherein the luminescent spectrum thereof is shown in FIG. 1.

The First Comparative Embodiment

An emission spectral analysis of $Sr_2Si_5N_8$ fluorescent powder without a surface coating metallic compound was performed at room temperature via an exciting light with the wavelength of 420 nm to determine generation of a red-light emission peak with the peak value of 620 nm. $Sr_2Si_5N_8$ fluorescent powder having a surface coating metallic compound of the first embodiment has a luminance which was 1.04 times of that of $Sr_2Si_5N_8$ fluorescent powder without a surface coating metallic compound of the first comparative embodiment. Additionally, the two kinds of fluorescent powders were heated to 200° C. to analyze the high-temperature characteristics thereof, and an emission spectral analysis thereof was performed. It was found that both the two kinds of fluorescent powders generate a red-light emission peak with the peak value of 620 nm. However, the red-light luminance of the first comparative embodiment at a high temperature was degraded by 25% as compared with the red-light luminance thereof at a room temperature; on the other hand, the red-light luminance of the first embodiment at a high temperature was only degraded by 12% as compared with the red-light luminance thereof at a room temperature. Therefore, it was determined that the surface coating metallic compound has an increasing effect to both the room-temperature luminance and the fluorescent stability at high temperature.

Figure 2:
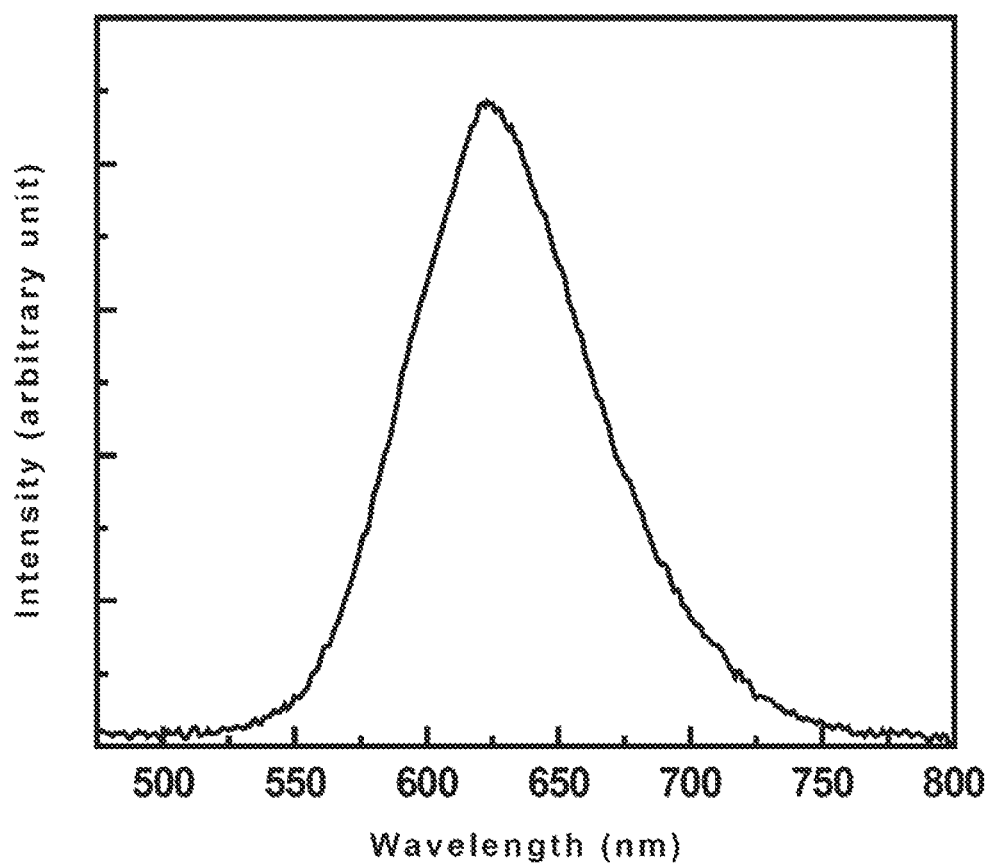
FIG. 2 is a luminescence spectrogram of a fluorescent powder prepared according to the second embodiment of the invention.

The Second Embodiment $CaAlSiN_3$ fluorescent powder was added into deionized water with continuous stirring, such that the powder was uniformly distributed in the solvent. Next, an appropriate amount of $In(NO_3)_3$ was added and dissolved in the solution with continuous stirring. During stirring, the pH value of the solution was adjusted to 8 by ammonia solution to generate an indium-ion-containing precipitate on the fluorescent powder. The solution was stirred continuously for 1 hour and then filtered to obtain a powder. The obtained powder was placed into a reducing furnace to heat in a nitrogen atmosphere at a temperature of 250° C. for 1 hour to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm, wherein the luminescent spectrum thereof is shown in FIG. 2.

The Second Comparative Embodiment

An emission spectral analysis of $CaAlSiN_3$ fluorescent powder without a nitride surface coating metallic compound was performed at room temperature via an exciting light with the wavelength of 420 nm to determine generation of the red-light emission peak with the peak value of 620 nm. $CaAlSiN_3$ fluorescent powder having a surface coating metallic compound of the second embodiment has a luminance, which was 1.05 times of that of $CaAlSiN_3$ fluorescent powder without a surface coating metallic compound of the second comparative embodiment. Additionally, the two kinds of fluorescent powders were heated to 200° C. to analyze the high-temperature characteristic thereof, and an emission spectral analysis thereof was performed. It was found that both the two kinds of fluorescent powders generate a red-light emission peak with the peak value of 620 nm. However, the red-light luminance of the second comparative embodiment at a high temperature was degraded by 21% as compared with the red-light luminance thereof at a room temperature; on the other hand, the red-light luminance of the second embodiment at a high temperature was only degraded by 16% as compared with the red-light luminance thereof at a room temperature. Therefore, it was determined that the surface coating metallic compound has an increasing effect to both the room-temperature luminance and the fluorescent stability at high temperature.

The Third Embodiment $Sr_2Si_5N_8$ fluorescent powder was added into deionized water with continuous stirring, such that the powder was uniformly distributed in the solvent. Next, an appropriate amount of $Mg(NO_3)_2$ was added and dissolved in the solution with continuous stirring. During stirring, the pH value of the solution was adjusted to 14 by ammonia solution to generate a magnesium-ion-containing precipitate on the fluorescent powder. The solution was stirred continuously for 1 hour and then filtered to obtain a powder. The obtained powder was placed into a reducing furnace to heat in a nitrogen atmosphere at a temperature of 150° C. for 3 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 150° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Fourth Embodiment $(Sr_{0.7}Ba_{0.3})_2Si_5N_8$ fluorescent powder was added into deionized water with continuous stirring, such that the powder was uniformly distributed in the solvent. Next, an appropriate amount of $Ca(NO_3)_2$ was added and dissolved in the solution with continuous stirring. During stirring, the pH value of the solution was adjusted to 14 by ammonia solution to generate a calcium-ion-containing precipitate on the fluorescent powder. The solution was stirred continuously for 1 hour and then filtered to obtain a powder. The obtained powder was placed into a reducing furnace to heat in a nitrogen atmosphere at a temperature of 350° C. for 2 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 610 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 610 nm.

The Fifth Embodiment $CaAlSiN_3$ fluorescent powder was added into deionized water with continuous stirring, such that the powder was uniformly distributed in the solvent. Next, an appropriate amount of $Sr(NO_3)_2$ was added and dissolved in the solution with continuous stirring. During stirring, the pH value of the solution was adjusted to 14 by ammonia solution to generate a strontium-ion-containing precipitate on the fluorescent powder. The solution was stirred continuously for 1 hour and then filtered to obtain a powder. The obtained powder was placed into a reducing furnace to heat in a argon atmosphere at a temperature of 200° C. for 2 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Sixth Embodiment $CaAlSiN_3$ fluorescent powder was added into deionized water with continuous stirring, such that the powder was uniformly distributed in the solvent. Next, an appropriate amount of $Ba(NO_3)_2$ was added and dissolved in the solution with continuous stirring. During stirring, the pH value of the solution was adjusted to 14 by ammonia solution to generate a barium-ion-containing precipitate on the fluorescent powder. The solution was stirred continuously for 1 hour and then filtered to obtain a powder. The obtained powder was placed into a reducing furnace to heat in a nitrogen atmosphere at a temperature of 200° C. for 2 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Seventh Embodiment $Sr_2Si_5N_8$ fluorescent powder was added into deionized water with continuous stirring, such that the powder was uniformly distributed in the solvent. Next, an appropriate amount of $La(NO_3)_3$ was added and dissolved in the solution with continuous stirring. During stirring, the pH value of the solution was adjusted to 12 by ammonia solution to generate a lanthanum-ion-containing precipitate on the fluorescent powder. The solution was stirred continuously for 1 hour and then filtered to obtain a powder. The obtained powder was placed into a reducing furnace to heat in a nitrogen atmosphere at a temperature of 400° C. for 1 hour to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Eighth Embodiment $CaAlSiN_3$ fluorescent powder was added into deionized water with continuous stirring, such that the powder was uniformly distributed in the solvent. Next, an appropriate amount of $Cu(NO_3)_2$ was added and dissolved in the solution with continuous stirring. During stirring the pH value of the solution was adjusted to 10 by ammonia solution to generate a copper-ion-containing precipitate on the fluorescent powder. The solution was stirred continuously for 1 hour and then filtered to obtain a powder. The obtained powder was placed into a reducing furnace to heat in a nitrogen atmosphere at a temperature of 200° C. for 2 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Ninth Embodiment $CaAlSiN_3$ fluorescent powder was added into deionized water with continuous stirring, such that the powder was uniformly distributed in the solvent. Next, an appropriate amount of $Ni(NO_3)_2$ was added and dissolved in the solution with continuous stirring. During stirring the pH value of the solution was adjusted to 10 by ammonia solution to generate a nickel-ion-containing precipitate on the fluorescent powder. The solution was stirred continuously for 1 hour and then filtered to obtain a powder. The obtained powder was placed into a reducing furnace to heat in a nitrogen atmosphere at a temperature of 200° C. for 2 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Tenth Embodiment $(Sr_{0.7}Ca_{0.3})_2Si_5N_8$ fluorescent powder was added into deionized water with continuous stirring, such that the powder was uniformly distributed in the solvent. Next, an appropriate amount of $Ga(NO_3)_3$ was added and dissolved in the solution with continuous stirring. During stirring the pH value of the solution was adjusted to 8 by ammonia solution and nitric acid to generate a gallium-ion-containing precipitate on the fluorescent powder. The solution was stirred continuously for 1 hour and then filtered to obtain a powder. The obtained powder was placed into a reducing furnace to heat in a nitrogen atmosphere at a temperature of 350° C. for 1 hour to prepare a fluorescent powder having a surface coating metallic compound. An emission spectral analysis of the fluorescent powder was performed at room temperature via an exciting light with the wavelength of 420 nm to determine generation of the red-light emission peak with the peak value of 630 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 630 nm.

The Eleventh Embodiment

CaAlSiN$_3$ fluorescent powder was added into deionized water with continuous stirring, such that the powder was uniformly distributed in the solvent. Next, an appropriate amount of Mn(NO$_3$)$_2$ was added and dissolved in the solution with continuous stirring. During stirring the pH value of the solution was adjusted to 10 by ammonia solution and nitric acid to generate a manganese-ion-containing precipitate on the fluorescent powder. The solution was stirred continuously for 1 hour and then filtered to obtain a powder. The obtained powder was placed into a reducing furnace to heat in a vacuum atmosphere at a temperature of 150° C. for 2 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Twelfth Embodiment (Sr$_{0.7}$Ba$_{0.3}$)$_2$Si$_5$N$_8$ fluorescent powder was added into deionized water with continuous stirring, such that the powder was uniformly distributed in the solvent. Next, an appropriate amount of Sb(NO$_3$)$_3$ was added and dissolved in the solution with continuous stirring. During stirring the pH value of the solution was adjusted to 8 by heating urea to generate a stibium-ion-containing precipitate on the fluorescent powder. The solution was stirred continuously for 1 hour and then filtered to obtain a powder. The obtained powder was placed into a reducing furnace to heat in a nitrogen atmosphere at a temperature of 300° C. for 0.5 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 610 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 610 nm.

The Thirteenth Embodiment

Sr$_2$Si$_5$N$_8$ fluorescent powder was added into deionized water with continuous stirring, such that the powder was uniformly distributed in the solvent. Next, an appropriate amount of Bi(NO$_3$)$_3$ was added and dissolved in the solution with continuous stirring. During stirring the pH value of the solution was adjusted to 14 by NaOH to generate a bismuth-ion-containing precipitate on the fluorescent powder. The solution was stirred continuously for 1 hour and then filtered to obtain a powder. The obtained powder was placed into a reducing furnace to heat in a nitrogen atmosphere at a temperature of 200° C. for 6 hours to prepare a fluorescent powder having a surface coating metallic compound. An emission spectral analysis of the fluorescent powder was performed at room temperature via an exciting light with the wavelength of 420 nm to determine generation of the red-light emission peak with the peak value of 620 nm. Additionally, the fluorescent powder was heated to 200° C. to analyze the high-temperature characteristic thereof, and an emission spectral analysis of the fluorescent powder was performed via an exciting light with the wavelength of 420 nm to confirm generation of the red-light emission peak with the peak value of 620 nm.

The Fourteenth Embodiment

Figure 3:
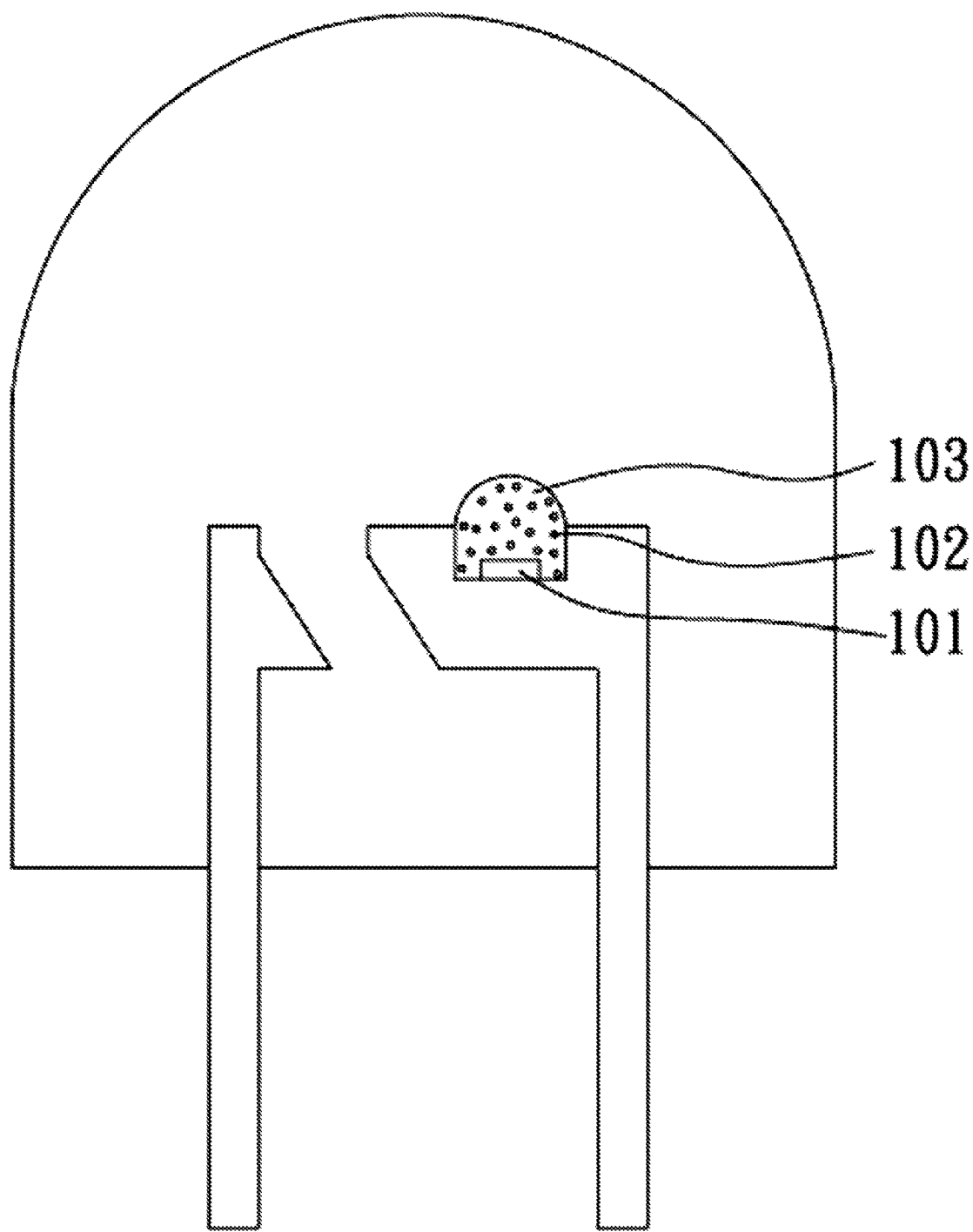
FIG. 3 is a schematic view of the LED device of the fourteenth embodiment of the invention.

Here the inorganic nitride-based fluorescent material prepared from the aforesaid embodiments was used to manufacture the LED device of this embodiment. As shown in FIG. 3, the LED device of this embodiment includes a LED chip 101 and a packaging gel 103 containing the inorganic nitride-based fluorescent material 102 prepared according to the first to thirteenth embodiments of the invention, wherein the packaging gel 103 covers the light-exiting surface of the LED chip 101. In this embodiment, the LED chip 101 was a blue LED chip with a luminance wavelength of 460 nm. It was confirmed that the fluorescent material could generate red light.

The aforesaid embodiments are only taken as examples for the purpose of easy illustration, and the scope of the invention is defined by the claims, not only limited by the aforesaid embodiments.

What is claimed is:

1. An inorganic nitride-based fluorescent material, comprising:

an inorganic fluorescent host material represented by the following formula (I):

(M)xSiyNz:At  (I)

wherein, M is at least one metal selected from the group consisting of metals of IIA and IIIA, x being from 1.0 to 3.0, y being from 0.7 to 6.0, z being from 1.0 to 9.0, At being an activator; and a surface coating material of at least one metal hydroxide or metal carbonate, and the metal of the metal hydroxide or the metal carbonate is selected from the group consisting of Mg, Ca, Sr, Ba, V, Cr, Mn, Fe, Co, Ni, Cu, La, Ga, In, Sn, Sb and Bi.

2. The inorganic fluorescent material of claim 1, wherein in the formula (I) M is at least one metal selected from the group consisting of calcium, strontium, barium or aluminum.

3. The inorganic fluorescent material of claim 1, wherein in the formula (I) M is calcium or aluminum.

4. The inorganic fluorescent material of claim 1, wherein x is from 1.5 to 2.5, and y is from 0.8 to 5.5, and z is from 2 to 8.5.

5. The inorganic fluorescent material of claim 1, wherein the activator At is selected from the group consisting of Ce, Pr, Nd, Pm, Sm, Eu, Gd, Dy, Ho, Er, Tm, Tb, Yb and Mn.

6. The inorganic fluorescent material of claim 1, wherein the thickness of the metal hydroxide, or the metal carbonate coated on the inorganic fluorescent host material is from 5 to 200 nm.

7. A method for preparing an inorganic fluorescent material, comprising:
 (A) preparing an inorganic fluorescent host material, wherein the inorganic fluorescent host material has a composition represented by the following formula (I):

$(M)_x Si_y N_z:At$  (I)

wherein, M is at least one metal selected from the group consisting of metals of IIA and IIIA,
 x being from 1.0 to 3.0,
 y being from 0.7 to 6.0,
 z being from 1.0 to 9.0,
 At being an activator;
 (B) adding the inorganic fluorescent host material into an inorganic metal salt solution to form a mixed solution under uniformly stirring, wherein the metal of the inorganic metal salt is selected from the group consisting of Mg, Ca, Sr, Ba, V, Cr, Mn, Fe, Co, Ni, Cu, La, Ga, In, Sn, Sb and Bi;
 (C) adjusting the pH value of the mixed solution prepared from step (B) via a pH regulator to precipitate an inorganic metal salt onto the inorganic fluorescent host material;
 (D) filtering the mixed solution prepared from step (C) to obtain the inorganic fluorescent host material with the inorganic metal salt thereonto; and
 (E) heating the inorganic fluorescent host material with the inorganic metal salt thereonto in a range of 100° C. to 600° C. to convert the inorganic metal salt to a surface coating material of metal oxide, metal hydroxide, or metal carbonate.

8. The method of claim 7, wherein the heating period is from 0.1 to 10 hours.

9. A LED device, characterized in that the LED device uses the inorganic nitride-based fluorescent material of claim 1 as a light-emitting material.

* * * * *